United States Patent

Eriksson et al.

[11] Patent Number: 6,011,815
[45] Date of Patent: Jan. 4, 2000

[54] COMPENSATED ΔΣ CONTROLLED PHASE LOCKED LOOP MODULATOR

[75] Inventors: Håkan B. Eriksson; Kjell B. Gustafsson, both of Lund; Björn M. G. Lindquist, Bjärred, all of Sweden

[73] Assignee: Telefonaktiebolaget LM Ericsson, Stockholm, Sweden

[21] Appl. No.: 08/931,302

[22] Filed: Sep. 16, 1997

[51] Int. Cl.[7] .................................................. H04L 25/49
[52] U.S. Cl. ........................ 375/296; 332/107; 375/376
[58] Field of Search .................................. 375/295, 296, 375/285, 374, 375, 376, 303, 304, 272; 332/100, 107

[56] References Cited

U.S. PATENT DOCUMENTS

| | | | |
|---|---|---|---|
| 4,179,670 | 12/1979 | Kingsbury | 331/10 |
| 4,204,174 | 5/1980 | King | 331/10 |
| 4,320,361 | 3/1982 | Kikkert | 332/112 |
| 4,609,881 | 9/1986 | Wells | 331/1 A |
| 4,800,342 | 1/1989 | Jackson | 331/10 |
| 4,965,531 | 10/1990 | Riley | 331/1 A |
| 5,038,117 | 8/1991 | Miller | 331/16 |
| 5,055,802 | 10/1991 | Hietala et al. | 331/16 |
| 5,079,521 | 1/1992 | Gaskell et al. | 331/1 A |
| 5,093,632 | 3/1992 | Hietala et al. | 331/1 A |
| 5,111,162 | 5/1992 | Hietala et al. | 332/127 |
| 5,124,670 | 6/1992 | Lawton | 331/10 |
| 5,903,194 | 5/1999 | Opsahl et al. | 331/1 A |

FOREIGN PATENT DOCUMENTS

| | | |
|---|---|---|
| 0 125 790 B1 | 11/1984 | European Pat. Off. . |
| 0 125 790 B2 | 11/1984 | European Pat. Off. . |
| 0 419 622 B1 | 4/1991 | European Pat. Off. . |
| 0 438 867 A3 | 7/1991 | European Pat. Off. . |
| 0 438 867 B1 | 7/1991 | European Pat. Off. . |
| 0 546 466 A1 | 6/1993 | European Pat. Off. . |
| 2 238 434 | 5/1991 | United Kingdom . |
| WO 86/05045 | 8/1986 | WIPO . |
| WO 86/05046 | 8/1986 | WIPO . |
| WO 90/12458 | 10/1990 | WIPO . |
| WO 96/17287 | 6/1996 | WIPO . |

OTHER PUBLICATIONS

Tom A.D.Riley et al., "Delta–Sigma Modulation in Fractional–N Frequency Synthesis" IEEE Journal of Solid State vol. 28, No. 5, May 1993, pp. 553–559.

"Forward Correction of Data Induced Noise in a Communication Channel", IBM Technical Disclosure Bulletin, vol. 39, No. 7, Jul. 1996, p. 57.

Michael H. Perrott, et al., "SP 22.2: A 27mW CMOS Fractional–N Synthesizer/Modulator IC", 1997 IEEE International Solid–State Circuit Conference, ISSCC97/Session 22/Communications Building Blocks II/Paper SP 22.2.

Brian Miller, "A Multiple Modulator Fractional Divider", IEEE Transactions on Instrumentation and Measurement, vol. 40, No. 3, Jun. 1991, pp. 578–583.

Thomas A. D. Riley, et al., "A Simplified Continuous Phase Modulator Technique", IEEE Transactions on Circuits and Systems II: Analog and Digital Signal Processing, May 1994, vol. 41, No. 5, pp. 321–328.

*Primary Examiner*—Tesfaldet Bocure
*Attorney, Agent, or Firm*—Burns, Doane, Swecker & Mathis, L.L.P.

[57] ABSTRACT

A ΔΣ controlled phase locked loop modulation is used with limited oversampling factors while fulfilling the spectrum and/or phase noise requirements on the modulation in the phase locked loop. By filtering the quantization noise sufficiently then compensating for the distortion of the modulation at the input of the ΔΣ modulator, the required oversampling factor of the ΔΣ controlled phase locked loop modulators can be reduced without loss of performance. The distortion is mitigated by performing a compensation at the input to the ΔΣ modulator. The noise reduction obtained by lowering the bandwidth of the phase locked loop can then be traded to reduce the oversampling factor.

17 Claims, 7 Drawing Sheets

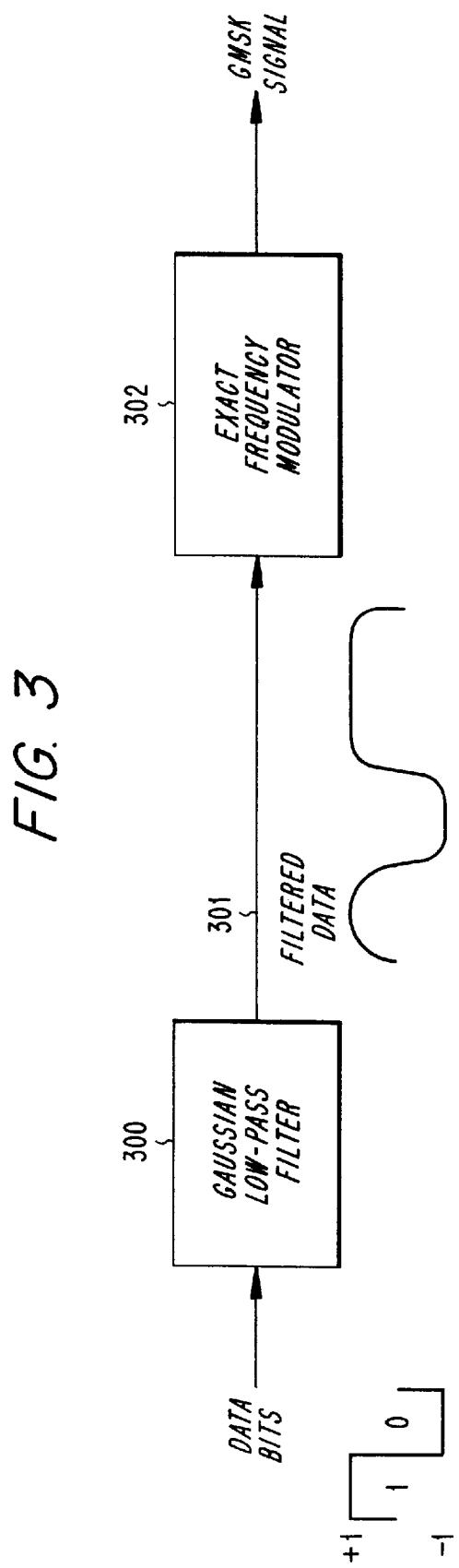

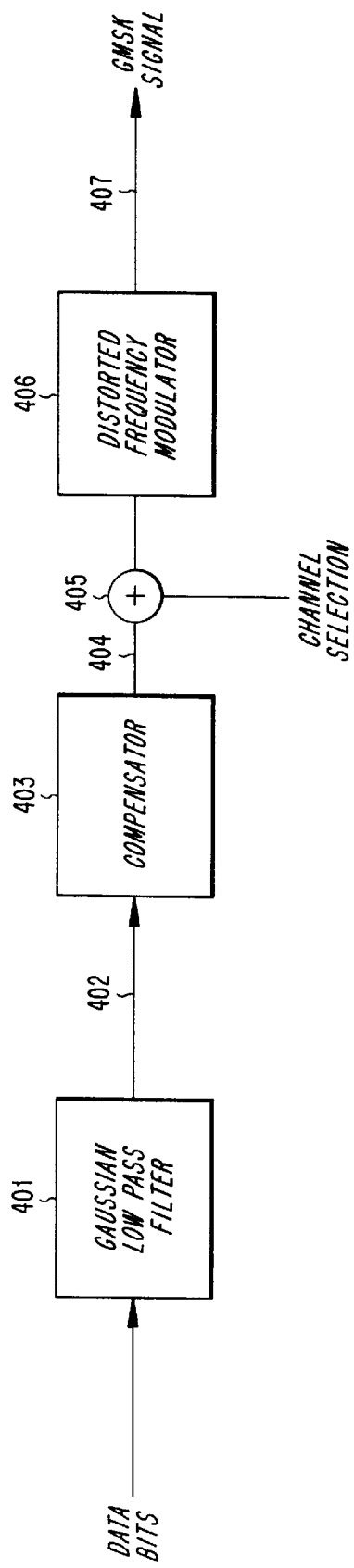
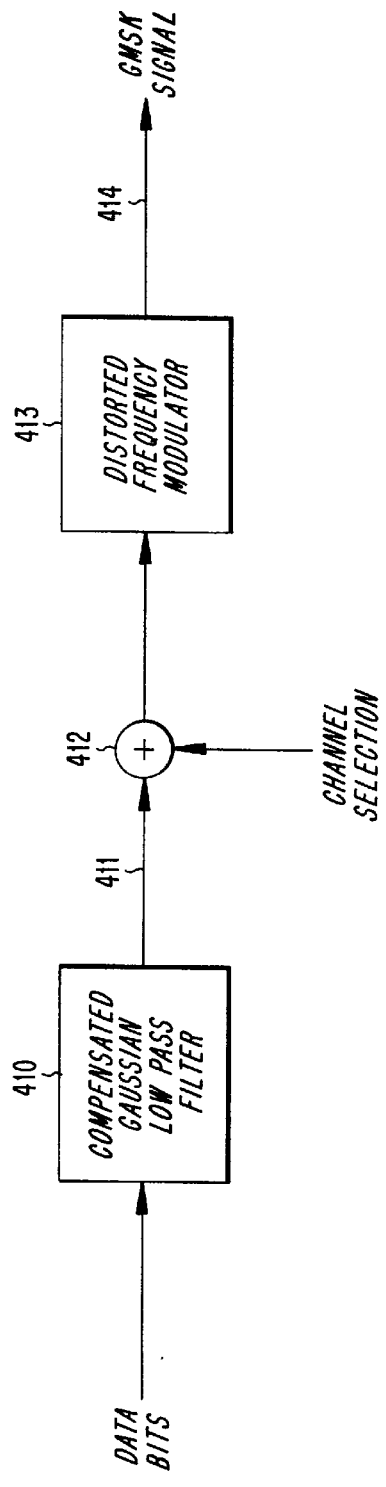
FIG. 4(a)
FIG. 4(b)

COMPENSATED ΔΣ CONTROLLED PHASE LOCKED LOOP MODULATOR

FIELD OF THE INVENTION

The invention relates to all areas where digital communications are performed using phase modulation or other modulation schemes where the phase of the carrier is used to carry information, for example, continuous phase modulation (CPM), frequency shift keying (FSK) and quadrature amplitude modulation (QAM).

BACKGROUND OF THE INVENTION

The implementation of continuous phase modulation has traditionally relied on the use of quadrature modulators. As illustrated in FIG. 1, a digital signal processing unit 101 receives the information to be transmitted via input signal 100 and generates the in-phase and quadrature components of the signal. These components are converted to analog signals using digital/analog converters 102a and 102b and low pass filters 103a and 103b. The output of each filter modulates using multipliers 104a and 104b, one of two carriers 105a or 105b that are separated by 90° in phase. The outputs of the multipliers are then summed in an adder 106 to form the signal 107 which is to be amplified and transmitted.

Recently, continuous phase modulation based on using a ΔΣ modulator to control the division factor of a fractional-N phase lock loop was proposed by Riley et al. in "A Simplified Continuous Phase Modulation Technique," IEEE Transaction on Circuits and Systems-II: Analog and Digital Signal Processing," Vol. 41, pp. 321–326, May, 1994. Phase locked loop frequency synthesis is a well-known technique for generating one of many related signals from a frequency variable voltage controlled oscillator (VCO). In a phase locked loop (PLL), an output signal from the VCO is coupled to a programmable frequency divider which divides the output signal by a selected integer in order to generate a frequency divided signal that is supplied to a phase detector. The phase detector compares the frequency divided signal to a reference signal from another fixed frequency oscillator which, often, is selected for stability of frequency over time and environmental changes. Any difference in phase between the frequency divided signal and the reference signal is output from the phase detector, coupled through a loop filter, and applied to the VCO in a manner which causes the output signal from the VCO to change in frequency such that the phase error between the frequency divided signal and the reference signal is minimized. With a constant division factor, the output frequency step size is constrained to be equal to the reference signal frequency. With the PLL, an engineering compromise must be struck between the competing requirements of loop lock time, output frequency step size, noise performance and spurious signal generation.

In order to overcome the limitations of the PLL, programmable frequency dividers capable of effectively dividing by non-integers have been developed. Output frequency step sizes which are fractions of the reference signal frequency are obtained while maintaining a high reference frequency and wide loop bandwidth. The synthesizers are known as fractional-N frequency synthesizers.

Furthermore, a ΔΣ modulator can be used to control the frequency divider of the phase locked loop. Characteristics of a ΔΣ modulator are such that the quantization noise at its output tends to be toward the high end of the spectrum. The ΔΣ modulator is a quantizer that uses feedback to reduce the quantization noise in a limited frequency band. For this application, the ΔΣ modulator should preferably have low quantization noise within the bandwidth of the modulation. The ΔΣ modulator may be any type of ΔΣ modulator, such as one of those described in Steven R. Northsworthy, Richard Schrier and Gabor Temes, *Delta-Sigma Data Converters. Theory, Design and Simulation,* IEEE Press 1997.

A block diagram of a ΔΣ controlled phase locked loop modulator is illustrated in FIG. 2. A periodic reference signal 201 of frequency $f_{ref}$ is fed to a phase detector 202 together with the phase of the output of the frequency divider 206. The output of the phase detector 202 is a pulse that is related to the phase difference between the reference signal and the output of the frequency divider 206. The output of the phase detector 202 is filtered through a loop filter 203 and fed to a voltage controlled oscillator (VCO) 204. Due to the feedback in the phase locked loop, the frequency of the output 205 of the VCO 204 is driven to equal the reference frequency multiplied by the division factor in the frequency divider 206. Hence, the frequency of the output of the VCO 204 can be controlled by controlling the division factor. In the ΔΣ controlled phase locked loop modulator, the division factors are generated by using a ΔΣ modulator 210. The division factor of the frequency divider can be changed once every period of the reference frequency. A waveform generator 207 generates, based on the information signal 200, the input to the ΔΣ modulator. Channel selection can be performed by adding in an adder 208 an offset 209 to the input of the ΔΣ modulator. The output of the ΔΣ modulator is then used to control the division factor in the frequency divider.

The output of the waveform generator is the instantaneous frequency of the desired modulated signal divided by the reference frequency and sampled at the rate of the reference frequency. The oversampling factor, η, of the ΔΣ controlled PLL modulator is $$\eta = \frac{f_{ref}}{\text{symbol rate}} \tag{1}$$

The input to the ΔΣ is the instantaneous frequency of the desired modulated signal sampled at a rate equal to $f_{ref}$. The reference frequency $f_{ref}$ is chosen high enough and the bandwidth of the PLL wide enough for the modulation to fulfill the spectrum and/or the phase noise requirement on the modulation.

As the phase locked loop is a low pass filter, with respect to the instantaneous frequency, the phase locked loop can be regarded as a means for reconstruction of the desired modulation signal. By choosing the bandwidth of the PLL sufficiently high for the desired modulation to pass, the output of the VCO consists of a signal corresponding to the desired instantaneous frequency and phase noise corresponding to the quantization noise of the ΔΣ modulator. The phase noise can be reduced by either increasing the oversampling factor or by increasing the roll-off of the filtering performed by the phase locked loop. The latter is difficult without jeopardizing the stability margins of the phase locked loop. As a result, prior systems must rely on the use of high oversampling factors. However, a ΔΣ controlled PLL modulator has many benefits. For example, it enables a cost and space efficient implementation, it guarantees continuous phase and the modulation as well as channel selection can be controlled in a purely direct and digital manner.

In a mobile station and terminals in cordless cellular and satellite communication systems, or in any other equipment with limited power supply, it is desired to keep the oversampling factor of the PLL as low as possible. With a limited oversampling factor, however, the technique of ΔΣ controlled PLL modulation will fail the spectrum and/or the phase noise requirement on the modulation. This is because the filtering by the PLL will not be able to sufficiently filter the quantization noise without distorting the modulation. Thus, there is a need for a method and apparatus which allows ΔΣ controlled fractional-N PLL modulation with limited oversampling ratios to be used.

SUMMARY OF THE INVENTION

According to one aspect of the present invention, methods and apparatus are disclosed that enable the ΔΣ controlled phase locked loop modulation to be used with limited oversampling factors and thereby fulfill the spectrum and/or phase noise requirements on the modulation in the phase locked loop. By having the phase locked loop filter the quantization noise sufficiently and then compensating for the distortion of the modulation at the input of the ΔΣ modulator, the required oversampling factor of the ΔΣ controlled phase locked loop modulators can be reduced without loss of performance. The present invention mitigates the distortion by performing a compensation at the input to the ΔΣ modulator. This compensation is referred to as pre-filtering. The noise reduction obtained by lowering the bandwidth of the phase locked loop can then be traded to reduce the oversampling factor.

According to an exemplary embodiment of the present invention, a continuous phase modulator is disclosed. The continuous phase modulator contains a phase locked loop which has a detector means responsive to a reference signal and a phase control signal for generating a control signal that varies in dependence upon the phase difference between the reference signal and the phase control signal wherein the phase locked loop distorts the modulation of the phase locked loop. Means responsive to the control signal generates an output signal whose frequency varies in dependence upon the control signal. Dividing means divides the output signal to provide the phase control signal, said dividing means having a control input and being operable to vary its division factor in dependence upon a ratio control signal applied to said control input. A ΔΣ modulator provides the division factor control signal. Finally, the input into the ΔΣ modulator means is precompensated so as to compensate for the distortion introduced by the phase locked loop.

BRIEF DESCRIPTION OF THE DRAWINGS

The invention will now be described in more detail with reference to the accompanying drawings, in which:

FIG. 3 illustrates a method for producing a GMSK modulated signal;

FIGS. 4(a)–4(b) illustrate the generation of GMSK modulated signals according to several exemplary embodiments of the present invention;

DETAILED DESCRIPTION

The invention relates to continuous phase modulation (CPM). One example of a communication system where CPM is used is the GSM/DCS system. Although the invention is particularly suitable for a portable communications device, such as mobile stations and terminals in cordless cellular and satellite communication systems, the invention is not limited thereto.

Figure 1:
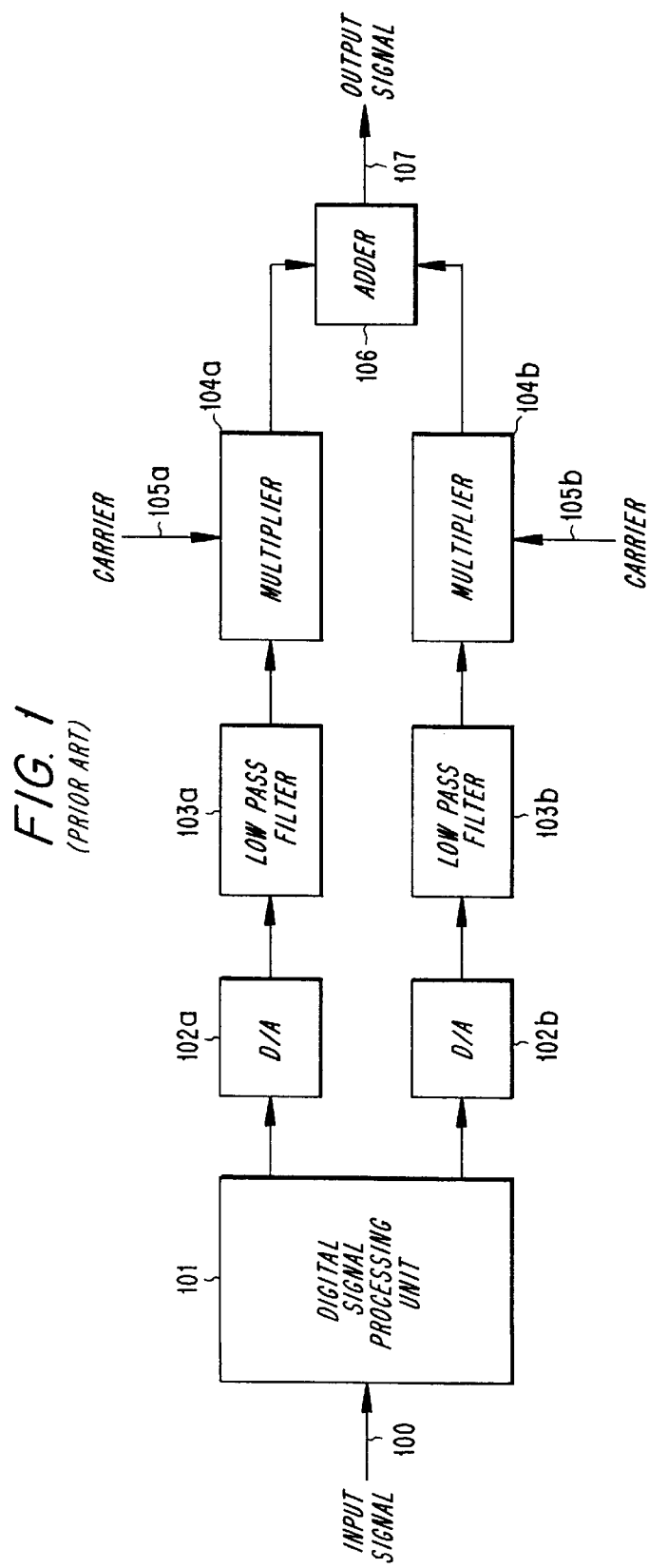
FIG. 1 illustrates a prior art quadrature modulator.
Figure 2:
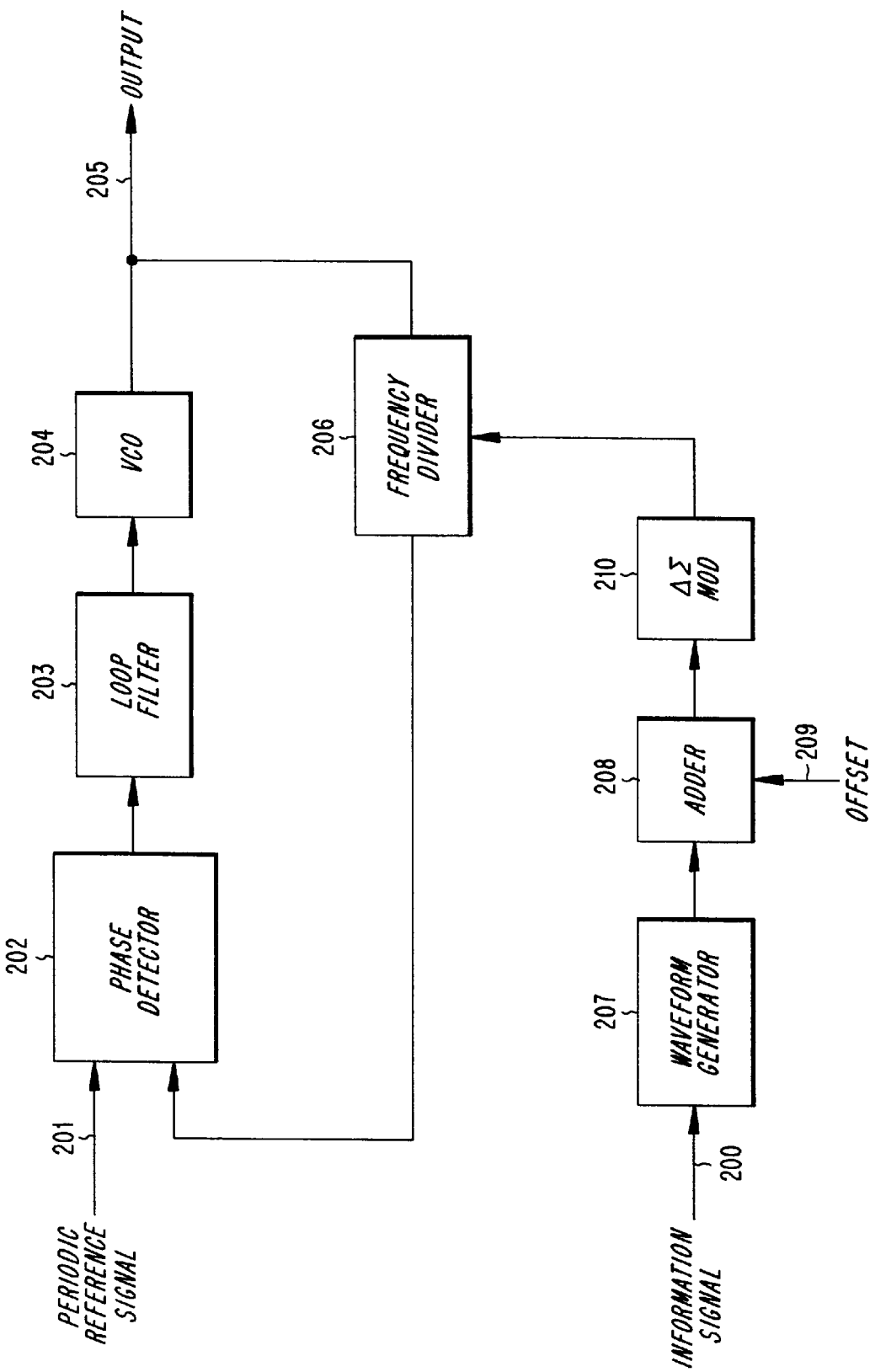
FIG. 2 illustrates a prior art ΔΣ controlled phase locked loop for generating continuous phase modulation.

A radio transceiver that is useful in a digital radio telephone system may advantageously employ the present invention. The GSM Pan European Digital Radio Telephone System requires radio equipment capable of rapid changes of frequency and uses Gaussian Minimum Shift Keying (GMSK) modulation for the transmission of the digital data and digitized voice information. FIG. 3 illustrates a prior art method of producing a GMSK modulated signal. In FIG. 3, a data signal takes on a +1 signal value for a binary '1' and alternatively a −1 signal value for a binary '0'. The data signal is passed through a low-pass filter 300 which has a Gaussian filter response to produce a rounded frequency-modulating waveform. In the context of a modulator having the form illustrated in FIG. 2, the Gaussian low-pass filter 300 corresponds to the waveform generator 207. If the Gaussian filter has a DC gain of unity, the filtered data values (i.e., the rounded frequency-modulating waveform 301) will peak at +1 for a long series of continuous binary '1s' applied to the input, or −1 for a series of binary '0's.

The rounded frequency-modulating waveform 301 is applied to an exact frequency modulator 302 which generates a frequency (Fo+bitrate/4) for a value of +1 at its input and (Fo−bitrate/4) for a value of −1 at its input. The frequency deviation of +bitrate/4 corresponding to +1 at its input causes one quarter of a cycle (i.e., 90°) change in phase over one bit period, while an offset of −bitrate/4 causes a change in phase of −90° over a bit period. It is important for these frequency offsets to be exact or else there will be a cumulative deviation of the signal phase value from its expected phase when a series of '1's or '0's is applied at the data input.

Two exemplary embodiments of the present invention for generating GMSK modulated signals are illustrated in FIGS. 4(a)–4(b). Comparing FIG. 4(a) with FIG. 3, the ΔΣ modulator together with the PLL can be regarded as a frequency modulator. This frequency modulation is not perfect, however, and therefore compensation is performed at the input to the frequency modulator. In FIG. 4(a), the data signal is supplied to a Gaussian low pass filter 401 which outputs a filtered data signal 402. The filtered data signal 402 is then compensated in a compensator 403 which outputs a filtered and compensated data signal 404. The compensated data signal 404 is combined with a channel selection signal in a combiner 405 and is then applied to the ΔΣ-controlled PLL (distorted frequency modulator 406). The modulator 406 then outputs the GMSK signal 407. In FIG. 4(b), the compensation device and the Gaussian low pass filter are included in the same filter 410. The data signal is applied to the filter 410 which outputs a filtered and compensated signal 411. The compensated signal 411 is combined with the channel selection signal in a combiner 412 and is then supplied to the ΔΣ-controlled PLL (distorted frequency modulator 413). The modulator 413 then outputs the GMSK signal 414.

Figure 5:
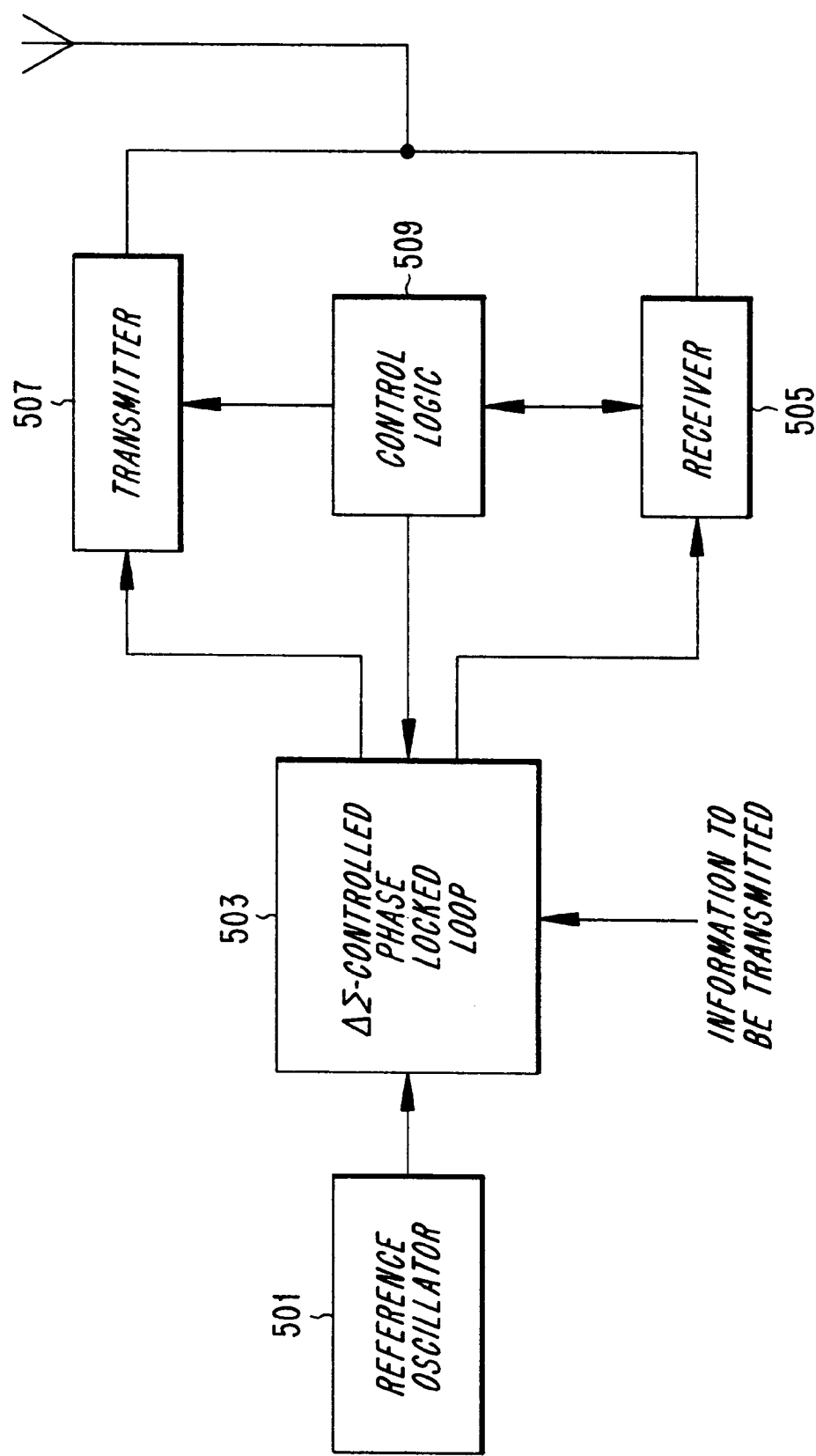
FIG. 5 is a block diagram of a radio transceiver which may employ the present invention.

A transceiver which can employ the present invention is illustrated in FIG. 5. A reference oscillator 501 provides a reference signal, $f_{ref}$, which remains relatively constant in frequency over time and in extremes of environment and is applied to a ΔΣ-controlled phase locked loop 503 along with the information to be transmitted. The output of the ΔΣ-controlled phase locked loop 503 is used by both the receiver 505 and the transmitter 507 to produce the local oscillator signal and the modulated transmit signal, respectively. In particular, the ΔΣ-controlled phase locked loop 503 supplies a phase-modulated signal to the transmitter 507, and a carrier signal to the receiver 505. In alternative embodiments, amplitude modulation can additionally be introduced in the transmitter 507 when, for example QAM is used. In this case, information to be transmitted should also be supplied to the transmitter 507. In any case, control over functions of the transceiver, such as channel of operation frequency, is provided by the control logic 509.

Figure 6:
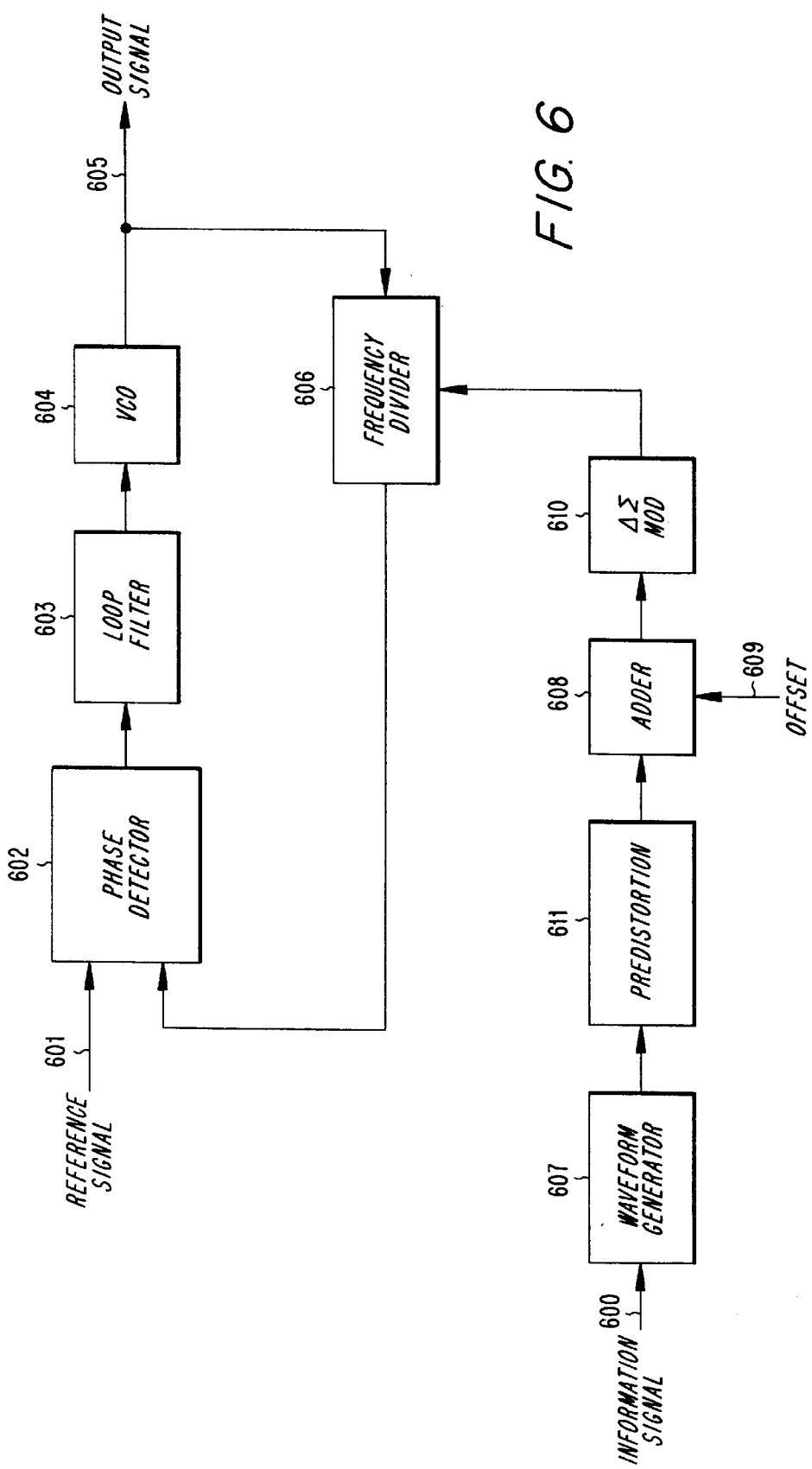
FIG. 6 illustrates a predistorted ΔΣ controlled phase locked loop for generating continuous phase modulation according to an exemplary embodiment of the present invention.

According to the present invention, the transceiver can be enhanced by using the predistorted ΔΣ controlled phase locked loop modulator depicted in FIG. 6. The phase locked loop consists of a phase detector 602, a loop filter 603, a voltage controlled oscillator 604, and a frequency divider 606. A periodic reference signal 601 of frequency $f_{ref}$ is fed to the phase detector 602 together with the phase of the output of the frequency divider 606. The output of the phase detector 602 is a pulse that is related to the phase difference between the reference signal and the output of the frequency divider 606. The output of the frequency detector 602 is filtered through a loop filter 603 and fed to a voltage controlled oscillator (VCO) 604. Due to the feedback in the phase locked loop, the frequency of the output of the VCO 604 is driven to equal the reference frequency multiplied by the division factor in the frequency divider 606. Hence, the frequency of the VCO 604 can be controlled by controlling the division factor. In the ΔΣ controlled phase locked loop modulator, the division factors are generated by using a ΔΣ modulator 610. According to this exemplary embodiment, the phase locked loop is designed so as to filter the phase noise sufficiently to fulfill the spectrum and/or the phase noise requirements on the modulation.

A waveform generator 607 receives an information signal 600 and generates an input to the ΔΣ modulator 610. The signal is predistorted in 611 so as to compensate for the distortion caused by the phase locked loop. By having the phase locked loop distort the modulation and by compensating for this distortion at the input of the ΔΣ modulator, the required oversampling factor of the ΔΣ controlled phase locked loop modulators can be reduced without loss of performance. Channel selection can be performed by adding in an adder 608 an offset 609 to the input of the ΔΣ modulator 610. The frequency divider is controlled by the ΔΣ modulator 610. The choice of the ΔΣ modulator is dependent on the application. Higher order ΔΣ modulators, possibly implemented using multi-stage (cascade) structures, could also be used. In general, the sampling rate and the number of stages in the ΔΣ modulator should be optimized with respect to the modulation bandwidth and method. To enable channel selection over a wide frequency range, the ΔΣ modulator 610 is preferably implemented as a multi-level ΔΣ modulator. The reference signal 601 is preferably a periodic signal. The output of the VCO forms the signal 605 which is to be amplified and transmitted.

As noted above, predistortion could be implemented by distorting the input of the ΔΣ modulator 610, that is, the desired instantaneous frequency, or by using a waveform generator where the desired predistortion affects the pulse shaping as defined by the modulation scheme. Predistortion enables the use of a phase locked loop with a bandwidth less than the bandwidth of the modulation. Thus, predistortion can be used as a means to relax the requirements on the loop filter, increase the stability margin of the phase locked loop, and enhance the performance.

The nature of the predistortion that compensates for the distortion in the phase locked loop will be further understood from the following discussion. A transfer function describing the influence of the division factor, N, on the instantaneous frequency of the output of the VCO 604 is given by $$F(s) = f_{ref} K_{VCO} I_{phd} \frac{H(s)}{N_0 s + K_{VCO} I_{phd} H(s)} \quad (2)$$

where H(s) is the transfer function of the loop filter 603, $f_{ref}$ is the frequency of the reference signal 601, $K_{VCO}$ is the gain in the VCO 604, $N_0$ is the average value of the division factor, N over time, and $I_{phd}$ is the gain in the phase detector 602.

The loop filter 603 is chosen such that the transfer function shown in Equation (2) is low-pass and the most important design parameter is its bandwidth. With a narrow bandwidth, the phase locked loop efficiently filters reference noise, internal noise and quantization noise. If the bandwidth of the phase locked loop is less than the bandwidth of the modulation, however, the phase locked loop will linearly distort the modulated signal. The invention addresses this problem by having a phase locked loop with a bandwidth less than the bandwidth of the modulation, and compensating for the linear distortion at the input of the ΔΣ modulator 610. The compensation is then a linear filter having an impulse response that equals or approximates the inverse of Equation (2).

The compensation may be combined together with the shaping as defined by the modulation. What follows is an example showing how this can be done for GMSK modulation. Let f(t) denote the impulse response of $F(s)/f_{ref}$. Furthermore, let g(t) denote the desired pulse-shaping. For the GSM system, we have $$g(t) = a(t) * \mathrm{rect}\left(\frac{t}{T_b}\right) \quad (3)$$

where the function rect(x) is defined by $$\mathrm{rect}\left(\frac{t}{T_b}\right) = \begin{cases} 1/T_b & \text{for } |t| < T_b/2 \\ 0 & \text{otherwise} \end{cases} \quad (4)$$

and the operator "*" denotes convolution. Also, a(t) is defined by $$a(t) = \frac{1}{\sqrt{2\pi}\,\sigma T_b} \exp\left(-\frac{t^2}{2\sigma^2 T_b^2}\right) \quad (5)$$

where $$\sigma = \frac{1}{2\pi BT_b}\sqrt{\ln(2)},$$

$$BT_b = 0.3 \text{ and}$$

$$T_b = 13 \cdot 10^6/48.$$

In order to have a convenient description of the design procedure, the previously mentioned quantities are sampled with a sampling rate equal to 1/T and a matrix formalism is used to represent the signals. Let h denote an L×1 vector which represents the impulse response of the compensated pulse-shaping. Let f denote an N×1-vector containing f(Tk) for k=0, 1, 2 . . . , N−1 and let g denote an N×1-vector containing g(Tk−3/2T$_b$) for k=0, 1, 2 . . . , N+L−2. A convolution matrix F of dimension ((N+L−2)×L) can now be constructed from f as $$F = \begin{pmatrix} f_0 & 0 & \cdots & 0 \\ f_1 & f_0 & \ddots & \vdots \\ \vdots & f_1 & \ddots & 0 \\ f_{N-1} & \vdots & \ddots & f_0 \\ 0 & f_{N-1} & \ddots & f_1 \\ \vdots & \ddots & \ddots & \vdots \\ 0 & \cdots & 0 & f_{N-1} \end{pmatrix}, \quad (6)$$

and the design problem can be formulated using matrix notations as follows. The overall pulse shaping is given by Fh. The desired pulse-shaping is given by g. The problem is to find an h so that Fh is as close to g as possible. One important characteristic of g is its static gain. This is because a deviation from the correct static gain may cause the phase of the VCO 604 to drift. In this description we consider the criteria:

$$\min_{h} \|Fh - g\|^2 \quad (7)$$

subject to $$\sum_i h_i = \sum_i g_i$$

The solution is given by $$\hat{h} = c \frac{\sum_i g_i}{\sum_i a_i} \quad (8)$$

where $$c = (F^T F)^{-1} F^T g \quad (9)$$

Figure 7:
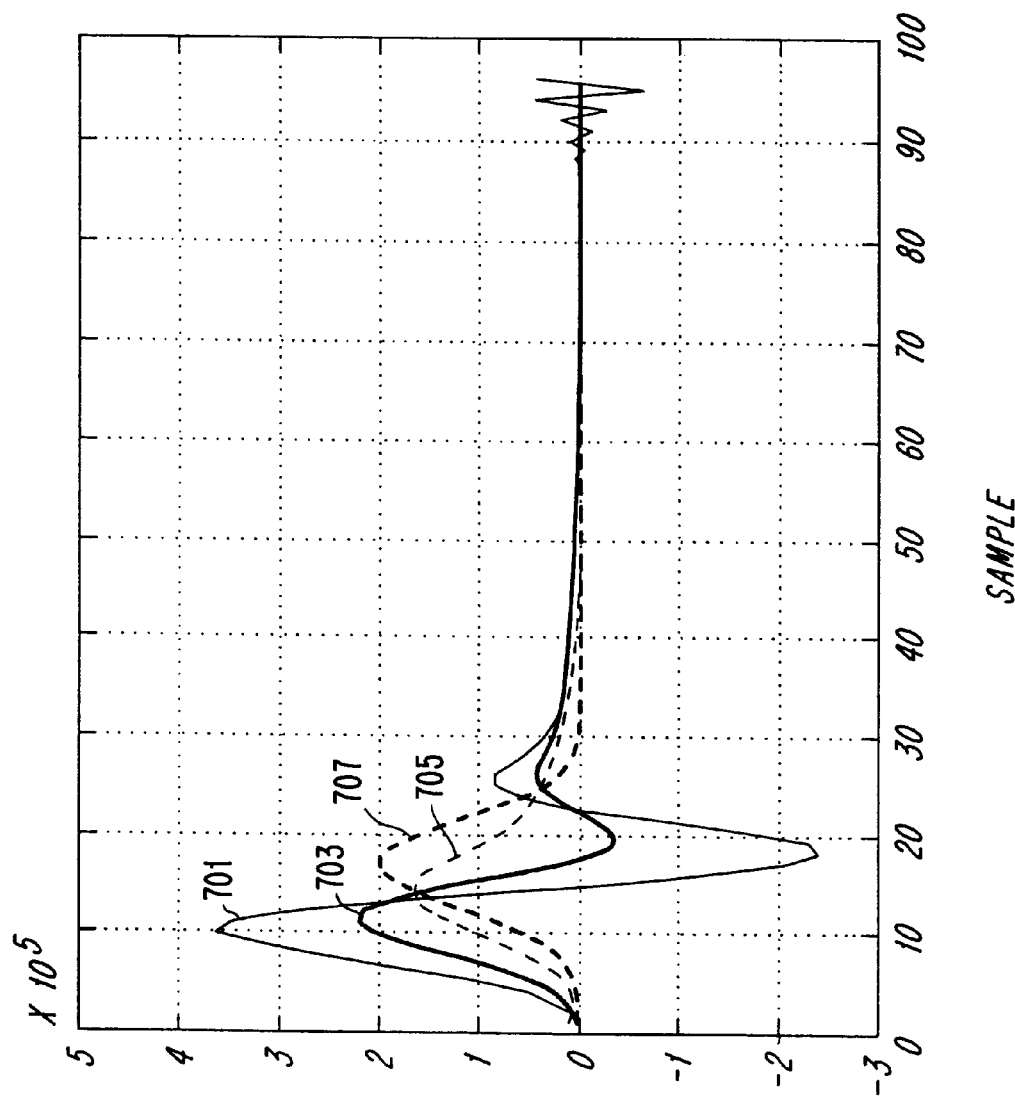
FIG. 7 is a graph showing exemplary impulse responses of a pulse-shaping filter in accordance with the present invention.

In FIG. 7, the impulse response of the pulse-shaping filter, g, is depicted for the uncompensated case as defined by GMSK modulation together with impulse responses that are compensated for three different phase locked loops having different bandwidths. Graph 701 depicts the pulse-shaping filter's impulse response for use with a phase locked loop having a bandwidth of 70 kHz. Graph 703 depicts the pulse-shaping filter's impulse response for use with a phase locked loop having a bandwidth of 120 kHz. Graph 705 depicts the pulse-shaping filter's impulse response for use with a phase locked loop having a bandwidth of 220 kHz. Finally, graph 707 depicts the shaping defined by GMSK modulation without any compensation. The sampling rate was 13/48/8 MS/s and the length of each shaping filter is 96 samples (12 symbols). The ringing in the lower right hand side of the figure is associated with graph 701 (i.e., the graph associated with the phase locked loop having a bandwidth equal to 70 kHz), and indicates that the length of the pre-filter may be too short: the compensated shaping may not be able to sufficiently compensate for the distortion in the phase locked loop.

It will be apparent to those of ordinary skill in the art that the present invention may be embodied in other specific forms without departing from the spirit or essential character thereof. The presently disclosed embodiments are, therefore, intended in all respects to be illustrative and not restrictive. The scope of the invention is indicated by the appended claims rather than the foregoing description, and all changes which come within the meaning and range of equivalents thereof are intended to be embraced therein.

What is claimed is:

1. A continuous phase modulator, comprising:
    a phase locked loop comprising
        detector means responsive to a reference signal and a phase control signal for generating a control signal that varies in dependence upon the phase difference between the reference signal and the phase control signal,
        means responsive to said control signal for generating an output signal whose frequency varies in dependence upon the control signal,
        means for dividing the output signal to provide the phase control signal, said dividing means having a control input and being operable to vary its division ratio in dependence upon a division factor control signal applied to said control input;
    ΔΣ modulator means responsive to an information signal to provide the division factor control signal thereby adjusting the division ratio of the frequency divider; and
    means for compensating for the distortion of the modulation of the phase locked loop at the input of the ΔΣ modulator using predistortion.

2. The continuous phase modulator according to claim 1, wherein the modulation of the phase locked loop is distorted by setting the bandwidth of the phase locked loop less than the bandwidth of the modulation.

3. The continuous phase modulator according to claim 1, wherein the means for compensating for the distortion of the modulation of the phase lock loop operates by letting the desired predistortion effect pulse shaping present for generating the input to the ΔΣ modulator.

4. The continuous phase modulator according to claim 1, wherein a channel selection is performed by adding an offset to the input of the ΔΣ modulator.

5. The continuous phase modulator according to claim 1, wherein said predistortion is implemented as a linear filter that supplies a signal to be processed by the ΔΣ modulator.

6. The continuous phase modulator according to claim 1, wherein said ΔΣ modulator means is a multi-level ΔΣ modulator which allows channel selection over a wide frequency range.

7. A method for modulating the division factor of a fractional-N phase locked loop, comprising the steps of:
    predistorting an information signal at an input to the ΔΣ modulator, wherein said predistortion of the information signal compensates for distortion generated by the phase locked loop;
    modulating said predistorted information signal in the ΔΣ modulator to produce a division factor control signal for adjusting a division ratio of a frequency divider in a feedback path of said phase locked loop.

8. The method according to claim 7, wherein said compensation is performed by letting the predistortion affect any pulse-shaping present for generating an input to the ΔΣ modulator.

9. The method according to claim 7, further comprising the step of:

providing for channel selection by adding an offset to the input of said ΔΣ modulator.

10. The method according to claim 7, wherein said predistortion is implemented as a linear filter that supplies a signal to be processed by the ΔΣ modulator.

11. The method according to claim 7, wherein multi-level ΔΣ modulators are used that allow for channel selection over a wide frequency range.

12. A portable communications device for use in a radio communications system, comprising:

means for transmitting and receiving radio signals;

reference oscillator means for generating a reference signal;

a phase locked loop, comprising detector means responsive to said reference signal and a phase control signal for generating a control signal that varies in dependence upon the phase difference between the reference signal and the phase control signal, means responsive to said control signal for generating an output signal to said transmitting and receiving means whose frequency varies in dependence upon the control signal, means for dividing the output signal to provide the phase control signal, said dividing means having a control input and being operable to vary its division ratio in dependence upon a division factor control signal applied to said control input;

ΔΣ modulator means responsive to an information signal to provide the division factor control signal thereby adjusting the division ratio of the frequency divider; and means for compensating for the distortion of the modulation of the phase locked loop at the input of the ΔΣ modulator means using predistortion.

13. The portable communications device according to claim 12, wherein the modulation of the phase locked loop is distorted by setting the bandwidth of the phase locked loop less than the bandwidth of the modulation.

14. The portable communications device according to claim 12, wherein the means for compensating for the distortion of the modulation of the phase lock loop operates by letting the desired predistortion effect pulse shaping present for generating the input to the ΔΣ modulator means.

15. The portable communications device according to claim 12, wherein a channel selection is performed by adding an offset to the input of the ΔΣ modulator means.

16. The portable communications device according to claim 12, wherein said predistortion is implemented as a linear filter that supplies a signal to be processed by the ΔΣ modulator means.

17. The portable communications device according to claim 12, wherein said ΔΣ modulator means is a multi-level ΔΣ modulator which allows channel selection over a wide frequency range.

* * * * *